United States Patent
Rexberg et al.

(10) Patent No.: US 9,590,664 B2
(45) Date of Patent: Mar. 7, 2017

(54) METHOD TO IMPROVE ACTIVE ANTENNA SYSTEM PERFORMANCE IN THE PRESENCE OF MUTUAL COUPLING

(71) Applicant: Telefonaktiebolaget L M Ericsson (publ), Stockholm (SE)

(72) Inventors: Leonard Rexberg, Hässelby (SE); Sairamesh Nammi, Kista (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 4 days.

(21) Appl. No.: 14/623,034

(22) Filed: Feb. 16, 2015

(65) Prior Publication Data
US 2016/0241277 A1    Aug. 18, 2016

(51) Int. Cl.
*H04B 1/04* (2006.01)
*H04B 17/10* (2015.01)
(Continued)

(52) U.S. Cl.
CPC ......... *H04B 1/0475* (2013.01); *H03F 1/3247* (2013.01); *H03F 3/24* (2013.01); *H04B 17/101* (2015.01); *H04B 17/11* (2015.01)

(58) Field of Classification Search
CPC ......... H01Q 11/12; H03F 1/26; H03F 1/3241; H03F 3/68; H03F 3/189; H04B 1/02;
(Continued)

(56) References Cited

U.S. PATENT DOCUMENTS 6,731,693 B1   5/2004   Damgaard
2003/0179041 A1*   9/2003   Weldon ................. H03F 1/3205
                                                                330/149
(Continued)

FOREIGN PATENT DOCUMENTS

EP   2 654 210 A1   10/2013

OTHER PUBLICATIONS

PCT Notification of Transmittal of the International Search Report and the Written Opinion of the International Searching Authority, or the Declaration with attached PCT Written Opinion of the International Searching Authority in International Application No. PCT/ib2016/050278, Dated Mar. 18, 2016 and received Apr. 22, 2016, 16 pages.
(Continued)

*Primary Examiner* — Shawkat M Ali
(74) *Attorney, Agent, or Firm* — Baker Botts, LLP

(57) ABSTRACT

A method in a network node comprises receiving a first input signal from a baseband processing unit of a first antenna branch, receiving a second input signal from a baseband processing unit of a second antenna branch, determining a first and second compensation coefficient, applying the first compensation coefficient to the second input signal to generate a first output signal, applying the second compensation coefficient to the first input signal to generate a second output signal, outputting the first output signal to a first power amplifier of the first antenna branch, the first output signal compensating for a mutual coupling from the second antenna branch to the first antenna branch, and outputting the second output signal to a second power amplifier of the second antenna branch, the second output signal compensating for a mutual coupling from the first antenna branch to the second antenna branch.

20 Claims, 12 Drawing Sheets

(51) Int. Cl.
*H04B 17/11* (2015.01)
*H03F 1/32* (2006.01)
*H03F 3/24* (2006.01)

(58) Field of Classification Search
CPC .......... H04B 1/04; H04B 1/0475; H04B 1/10; H04B 1/38; H04B 7/04; H04B 17/00; H04B 17/14; H04B 17/21; H04B 2001/0408; H04J 1/12; H04L 5/06; H04L 5/14; H04L 25/02; H04L 27/36
USPC ......... 330/103, 124, 149; 370/201; 375/219, 375/267, 295–297; 455/63, 73, 101, 102, 455/114.3, 115.1
See application file for complete search history.

(56) References Cited

U.S. PATENT DOCUMENTS

| | | | | |
|---|---|---|---|---|
| 2004/0101065 A1* | 5/2004 | Hagh | ............ | H04L 27/362 375/297 |
| 2005/0017800 A1* | 1/2005 | Robinson | ............ | H03F 1/3223 330/149 |
| 2007/0159245 A1* | 7/2007 | Kim | ............ | H03F 1/3223 330/149 |
| 2010/0316157 A1 | 12/2010 | Bassam et al. | | |
| 2011/0151806 A1* | 6/2011 | Kenington | ............ | H01Q 3/28 455/101 |
| 2012/0154033 A1* | 6/2012 | Lozhkin | ............ | H03F 1/3247 330/124 R |
| 2012/0313700 A1 | 12/2012 | Bai | | |
| 2013/0052964 A1 | 2/2013 | Husted | | |
| 2014/0009224 A1* | 1/2014 | van Zelm | ............ | H03F 3/68 330/84 |
| 2015/0028947 A1* | 1/2015 | Lozhkin | ............ | H03F 3/189 330/149 |
| 2015/0085634 A1* | 3/2015 | Yu | ............ | H04B 1/005 370/201 |
| 2015/0117508 A1* | 4/2015 | Gomez | ............ | H04L 25/03343 375/232 |

OTHER PUBLICATIONS

Seyed Aidin Bassam, et al. "Crossover Digital Predistorter for the Compensation of Crosstalk and Nonlinearity in MIMO Transmitters," *IEEE Transactions on Microwave Theory and Techniques*, vol. 57, No. 5, May 2009, 10 pages.

* cited by examiner

METHOD TO IMPROVE ACTIVE ANTENNA SYSTEM PERFORMANCE IN THE PRESENCE OF MUTUAL COUPLING

TECHNICAL FIELD

The present disclosure relates, in general, to wireless communications and, more particularly, to a method to improve active antenna system performance in the presence of mutual coupling.

BACKGROUND

Active array antennas have individual power amplifiers on each antenna branch or bundled antenna branches (sub-arrays). Although individually linearized towards its own transmitted signal, coupling between individual antenna elements in the array may cause backwards intermodulation. That is, an adjacent antenna element in the array may couple power back to the input of its neighbor antenna element amplifier, causing intermodulation and giving rise to unwanted spurious emissions. These unwanted spurious emissions can be much higher than the linearized amplifier output emissions would have been themselves. The reason for this is that the leakage signal power to its neighbor antenna element, although lower in level relative to the intentionally transmitted signal (usually 10-20 dB lower), does not undergo linearization in the neighbor signal path, but will rather form intermodulation by itself in the amplifier. Thus, there is a need to prevent intermodulation from occurring in active antenna arrays having individual power amplifiers on each antenna branch or bundled antenna branch.

Existing solutions for counteracting this unwanted backwards intermodulation behavior have certain deficiencies. These solutions usually show low improvements, and can be complicated to implement. For example, one proposed solution involves cross coupling of non-linear parts of the individual signal paths to form a compensation tree. This approach becomes problematic, however, because the number of antenna branches in an active antenna array can be quite large. Thus, the complexity increases very rapidly as more coupled antenna branches are added, and one wishes to counteract higher orders of intermodulation (i.e., not only the basic 3rd order intermodulation, but also the 5th, 7th and maybe also the 9th order intermodulation). In addition, there might also be a need to counteract memory effects in the amplifiers.

FIG. 1 illustrates an example of a passive antenna array system 100. Passive antenna array system 100 includes baseband processing unit 110, power amplifier 120, power combiner/divider and phase shifter 130, and one or more antennas 140. In passive antenna array system 100, the baseband signals from baseband processing unit 110 are boosted by power amplifier 120, which is connected to the antennas 140 by long feedback cables 150. The use of long feedback cables 150 may result in cable losses, potentially leading to decreased performance and increased energy consumption. Furthermore, installation of passive antenna systems may be more complex, and may require more equipment space.

FIG. 2 illustrates an active-array-antenna system 200. Active-array-antenna system (AAS) 200 may include radio frequency (RF) components, such as power amplifiers and transceivers integrated with an array of antenna elements. For example, AAS 200 may include baseband processing unit 210, radio transceiver array 220, and antennas 230. Baseband processing unit 210 may perform the processing functions of the AAS. Radio transceiver array 220 may include any suitable number of transceivers. Transceivers of radio transceiver array 220 may contain transmit chains and receive chains. Transmit chains may contain typical components such as filters, mixers, power amplifiers (PAs), and any other suitable components. Receive chains may contain typical components such as filtering, low noise amplifiers (LNAs), and any other suitable components. In some cases, the number of transmitters may not be equal to the number of receivers. AAS 200 may include any suitable number of antenna elements 230 in any suitable arrangement. For example, there exist a number of potential physical arrangements, which may include (but are not limited to) uniform linear, matrix and circular. Typically, cross polarized arrangements are deployed with an antenna element for each polarization. AAS 200 offers several benefits compared to deployments having passive antennas connected to transceivers through long feeder cables, such as passive antenna array 100 illustrated in FIG. 1. For example, by using active antenna array 200, cable losses may be reduced, leading to improved performance and reduced energy consumption. As another example, the installation may be simplified, and the required equipment space may be reduced.

AAS 200 may have numerous applications. As one example, AAS 200 may be able to perform one or more of cell specific beamforming, user specific beamforming, vertical sectorization, massive multiple input multiple output (MIMO), and elevation beamforming. AAS 200 may also be an enabler for further-advanced antenna concepts, such as deploying large numbers of MIMO antenna elements at an eNodeB. These techniques, however, will be useful in practice only if proper specification of relevant RF and electromagnetic compatibility (EMC) requirements are in place. For these reasons, 3GPP started a study item, and subsequently a work item, to define these requirements as well as the corresponding test methodology. In addition, currently, 3GPP is studying full-dimensional MIMO (FD-MIMO), and the feasibility to increase the number of transmit antennas to 16/32/64 for various purposes.

In general, for active antenna systems such as AAS 200 described above, the power amplifier needs to be operated in the non-linear region to achieve good efficiency. FIG. 3 shows a typical AM/AM curve for a power amplifier. Graph 300 charts a normalized input magnitude before power amplification on the x-axis and a normalized output magnitude after power amplification on the y-axis. From graph 300, it can be seen that the input/output curve is highly non-linear. When the power amplifier operates in the non-linear region, some of the signals are leaked to the other frequency bands (i.e., adjacent carrier bandwidths).

FIG. 4 shows spectral regrowth due to power amplifier non-linearity. Graph 400 includes power spectral density plots for non-linear power amplification 405 and ideal power amplification 410. It can be seen from FIG. 4 that the power spectral density plot is distorted, and there is a leakage of the desired signal to the adjacent channel bandwidths.

Adjacent channel leakage ratio (ALCR) is used as a metric to measure the leakage due to non-linear power amplification. In FIG. 4, the ACLR with ideal power amplification 410 is around −100 dBc, while with realistic power amplification (with non-linearity 405) the ACLR is around −38 dBc. One method to compensate for the non-linearity of the power amplifier is to distort the input signal to the power amplifier such that the output signal from the power amplifier is transformed to be close to what it would have been if the power amplifier would have been linear. This is how digital pre-distortion techniques (DPD) operate.

FIG. 5 shows spectral regrowth with DPD. Graph 500 illustrates the power spectral density plots for non-linear power amplification 505, ideal power amplification 510, and power amplification with DPD 515. It can be seen from FIG. 5 that the spectral regrowth is reduced when DPD techniques are applied. ACLR in this case is around −100 dBc.

In active antenna systems, in addition to the non-linear power amplifier, the signals from the adjacent antenna elements will be leaked in the backward direction. These leaked signals pass through the non-linear power amplifier without passing through the DPD techniques, and corrupt the desired signal. This is referred to as mutual coupling or crosstalk between antenna elements. The impact due to cross talk is severe when the distance between the antenna elements is very small. The normal distance between array elements in an array is in the order of 0.5λ, which usually means a relatively strong coupling.

FIG. 6 shows spectral regrowth due to mutual coupling in addition to the non-linear power amplification per each antenna element. More particularly, graph 600 illustrates power spectral density plots for non-linear power amplification without DPD 605, ideal power amplification 610, non-linear power amplification with DPD 615, power amplification and mutual coupling with DPD 620, and power amplification and mutual coupling without DPD 625. In FIG. 6, the value of mutual coupling was set to −18 dB between the antenna elements. It can be observed that when antenna coupling is present between antenna elements, DPD techniques fail, as the ACLR is increased to −38.2 dBc. This implies that it does not meet the requirements as set by 3GPP.

To mitigate the impact of mutual coupling, the crossover digital pre distortion (CO-DPD) technique was proposed. CO-DPD takes into consideration mutual coupling in the DPD formulation. The CO-DPD technique, however, requires substantial computational resources and power, and DPD techniques may be replaced by these new techniques. Replacing DPD techniques with these new techniques requires huge design effort, and may not be cost effective.

SUMMARY

Disclosed is a method in a network node. The method comprises receiving a first input signal from a baseband processing unit of a first antenna branch of the network node, receiving a second input signal from a baseband processing unit of a second antenna branch of the network node, determining a first compensation coefficient, and determining a second compensation coefficient. The method further comprises applying the first compensation coefficient to the second input signal received from the baseband processing unit of the second antenna branch to generate a first output signal, and applying the second compensation coefficient to the first input signal received from the baseband processing unit of the first antenna branch to generate a second output signal. The method further comprises outputting the first output signal to a first power amplifier of the first antenna branch, the first output signal compensating for a mutual coupling from the second antenna branch to the first antenna branch, the first power amplifier operating in a non-linear region, and outputting the second output signal to a second power amplifier of the second antenna branch, the second output signal compensating for a mutual coupling from the first antenna branch to the second antenna branch, the second power amplifier operating in the non-linear region.

The network node may be an active-array-antenna system base station. In certain embodiments, the method may further comprise applying one or more pre-distortion techniques to transform a first output signal of the baseband processing unit of the first antenna branch to compensate for a non-linearity of the first power amplifier, the first output signal of the baseband processing unit of the first antenna branch corresponding to the first input signal, and applying the one or more pre-distortion techniques to transform a second output signal of the baseband processing unit of the second antenna branch to compensate for a non-linearity of the second power amplifier, the second output signal of the baseband processing unit of the second antenna branch corresponding to the second input signal. The pre-distortion technique may include one of digital pre-distortion techniques and analog pre-distortion techniques. In certain embodiments, the mutual coupling from the second antenna branch to the first antenna branch comprises a leakage signal power from the second power amplifier that is leaked in a backward direction and passes through the first power amplifier without being transformed by the one or more pre-distortion techniques, and the mutual coupling from the first antenna branch to the second antenna branch comprises a leakage signal power from the first power amplifier that is leaked in a backward direction and passes through the second power amplifier without being transformed by the one or more pre-distortion techniques.

The first compensation coefficient and the second compensation coefficient may be predefined. The first compensation coefficient may be based at least in part on an estimation of a mutual coupling from the second antenna branch to the first antenna branch, and the second compensation coefficient may be based at least in part on an estimation of a mutual coupling from the first antenna branch to the second antenna branch. In certain embodiments, determining the first compensation coefficient and determining the second compensation coefficient may comprise setting the first compensation coefficient to a first value, setting the second compensation coefficient to a second value, measuring an adjacent channel leakage power ratio based at least in part on a first power amplifier output from the first power amplifier and a second power amplifier output from the second power amplifier, determining whether the adjacent channel leakage power ratio is less than an adjacent channel leakage power ratio threshold, and adjusting the first compensation coefficient and the second compensation coefficient upon determining that the adjacent channel leakage power ratio is more than the adjacent channel leakage power ratio threshold. The first value may be based at least in part on an estimation of a mutual coupling from the second antenna branch to the first antenna branch, and the second value may be based at least in part on an estimation of a mutual coupling from the first antenna branch to the second antenna branch. The adjacent channel leakage power ratio threshold may be approximately −45 dBc.

The first antenna branch and the second antenna branch may be two of a plurality of antenna branches of an antenna array of the network node, each of the plurality of antenna branches of the antenna array separated from each other by a distance, and compensation coefficients may only be determined for pairs of antenna branches separated by a threshold distance or less.

Also disclosed is a network node. The network node comprises one or more processors. The one or more processors are configured to receive a first input signal from a baseband processing unit of a first antenna branch of the network node, receive a second input signal from a baseband processing unit of a second antenna branch of the network node, determine a first compensation coefficient, and determine a second compensation coefficient. The one or more processors are configured to apply the first compensation coefficient to the second input signal received from the baseband processing unit of the second antenna branch to generate a first output signal, and apply the second compensation coefficient to the first input signal received from the baseband processing unit of the first antenna branch to generate a second output signal. The one or more processors are configured to output the first output signal to a first power amplifier of the first antenna branch, the first output signal compensating for a mutual coupling from the second antenna branch to the first antenna branch, the first power amplifier operating in a non-linear region, and output the second output signal to a second power amplifier of the second antenna branch, the second output signal compensating for a mutual coupling from the first antenna branch to the second antenna branch, the second power amplifier operating in the non-linear region.

In certain embodiments, the network node may be an active-array-antenna system base station. The one or more processors may be further configured to apply one or more pre-distortion techniques to transform a first output signal of the baseband processing unit of the first antenna branch to compensate for a non-linearity of the first power amplifier, the first output signal of the baseband processing unit of the first antenna branch corresponding to the first input signal, and apply the one or more pre-distortion techniques to transform a second output signal of the baseband processing unit of the second antenna branch to compensate for a non-linearity of the second power amplifier, the second output signal of the baseband processing unit of the second antenna branch corresponding to the second input signal. The pre-distortion technique may include one of digital pre-distortion techniques and analog pre-distortion techniques. The mutual coupling from the second antenna branch to the first antenna branch may comprise a leakage signal power from the second power amplifier that is leaked in a backward direction and passes through the first power amplifier without being transformed by the one or more pre-distortion techniques, and the mutual coupling from the first antenna branch to the second antenna branch may comprise a leakage signal power from the first power amplifier that is leaked in a backward direction and passes through the second power amplifier without being transformed by the one or more pre-distortion techniques.

In certain embodiments, the first compensation coefficient and the second compensation coefficient may be predefined. The first compensation coefficient may be based at least in part on an estimation of a mutual coupling from the second antenna branch to the first antenna branch, and the second compensation coefficient may be based at least in part on an estimation of a mutual coupling from the first antenna branch to the second antenna branch. In some embodiments, the one or more processors configured to determine the first compensation coefficient and determine the second compensation coefficient may comprise one or more processors configured to set the first compensation coefficient to a first value, set the second compensation coefficient to a second value, measure an adjacent channel leakage power ratio based at least in part on a first power amplifier output from the first power amplifier and a second power amplifier output from the second power amplifier, determine whether the adjacent channel leakage power ratio is less than an adjacent channel leakage power ratio threshold, and adjust the first compensation coefficient and the second compensation coefficient upon determining that the adjacent channel leakage power ratio is more than the adjacent channel leakage power ratio threshold. The first value may be based at least in part on an estimation of a mutual coupling from the second antenna branch to the first antenna branch, and the second value may be based at least in part on an estimation of a mutual coupling from the first antenna branch to the second antenna branch. The adjacent channel leakage power ratio threshold may be approximately −45 dBc.

In certain embodiments, the first antenna branch and the second antenna branch may be two of a plurality of antenna branches of an antenna array of the network node, each of the plurality of antenna branches of the antenna array separated from each other by a distance, and compensation coefficients may only be determined for pairs of antenna branches separated by a threshold distance or less.

Certain embodiments of the present disclosure may provide one or more technical advantages. For example, certain embodiments may provide improved adjacent channel power leakage ratio performance. As another example, certain embodiments may reduce computational complexity at the transmission side. As yet another example, certain embodiments may allow pre-distortion techniques to be reused to mitigate the non-linear impact due to power amplification, without a need for non-linear cross talk.

BRIEF DESCRIPTION OF THE DRAWINGS

For a more complete understanding of the disclosed embodiments and their features and advantages, reference is now made to the following description, taken in conjunction with the accompanying drawings, in which.

DETAILED DESCRIPTION

The present disclosure contemplates various embodiments that may compensate for mutual coupling effects between antenna elements, while at the same time using DPD techniques to compensate for the non-linear effects of the power amplifier. In certain embodiments, the linear part of the coupling may be cross-coupled, going past the linearizer for each branch. In other words, the leakage over different branches should be of the same order as the coupling between each antenna pair, but with an opposite sign, i.e., out-of-phase. This approach provides a way to overcome coupling effects in an array antenna, preventing coupled power from entering adjacent antenna elements in the backwards direction. In some embodiments, this linear technique also takes care of the non-linear effects of the amplifiers. The non-linear effects of cross coupling between antenna elements may be mitigated by feeding the input signals of the other antenna branches, but still using the DPD techniques for linearizing the power amplifier.

In the description that follows, certain concepts are described in relation to specific network features, but the described concepts are not limited to those features. For example, concepts described in relation to a NodeB or an eNodeB and a UE should not be considered as limited to those features, nor does it imply a certain hierarchical relation between the features. In some instances, the terms "NodeB" and "UE" could be replaced by the more general terms device 1 and device 2, respectively, with the two devices communicating with each other over some radio channel. The present disclosure may be equally applicable to transmissions in the downlink and transmissions in the uplink. Furthermore, the present disclosure may be applicable to any suitable wireless system, in particular for future 5G systems. Note further that in this disclosure, DPD techniques are described for linearization of a power amplifier. The compensation techniques described herein are not limited to digital domain (as in DPD), the same concept can be used for analog pre-distortion (APD).

Figure 1:
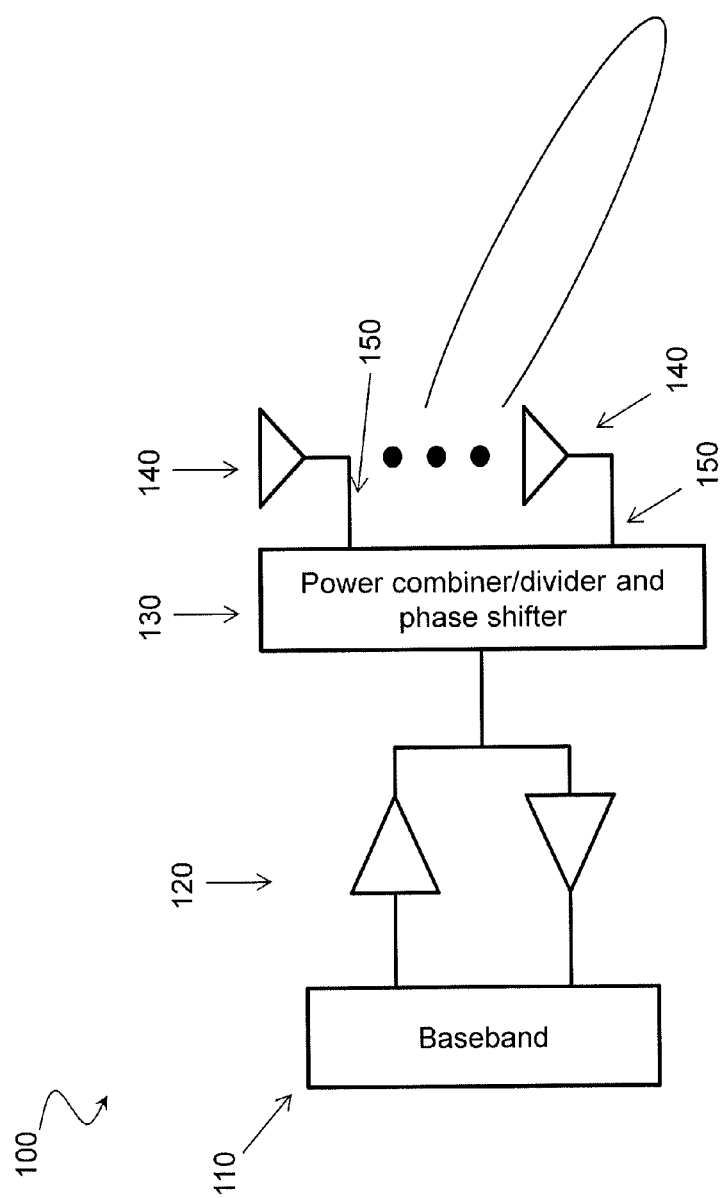
FIG. 1 illustrates an example of a passive antenna array system.
Figure 2:
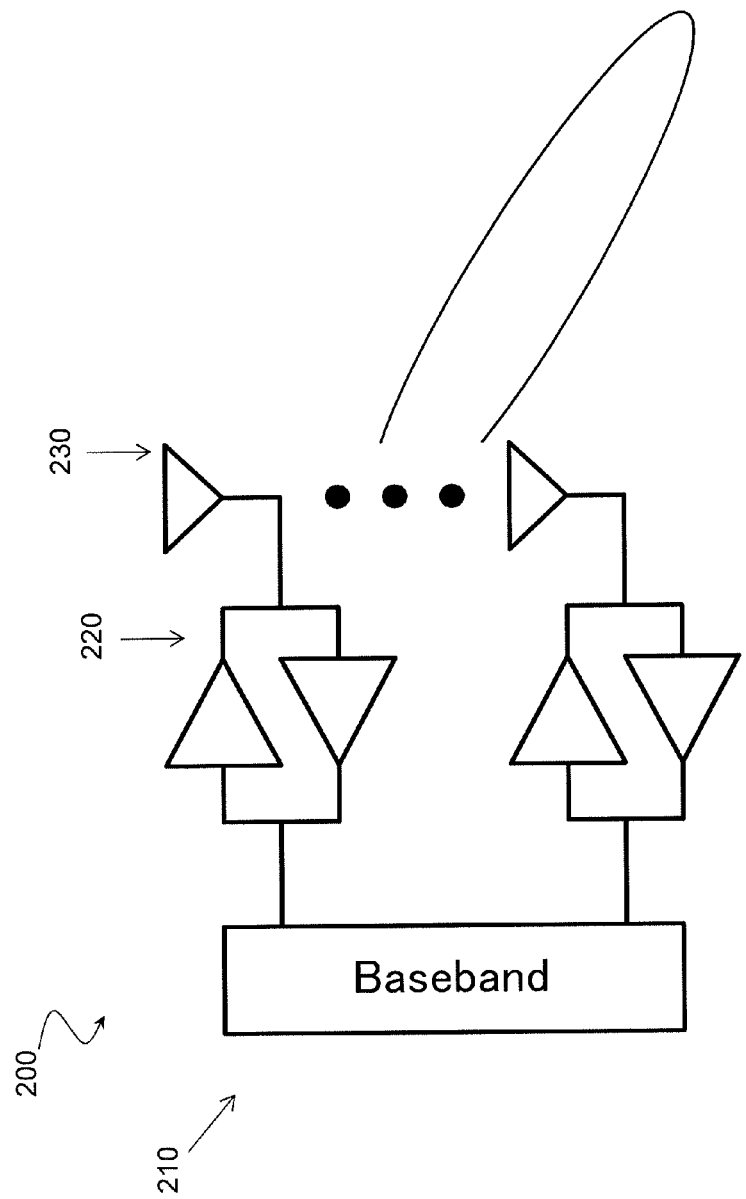
FIG. 2 illustrates an active-array-antenna system.
Figure 3:
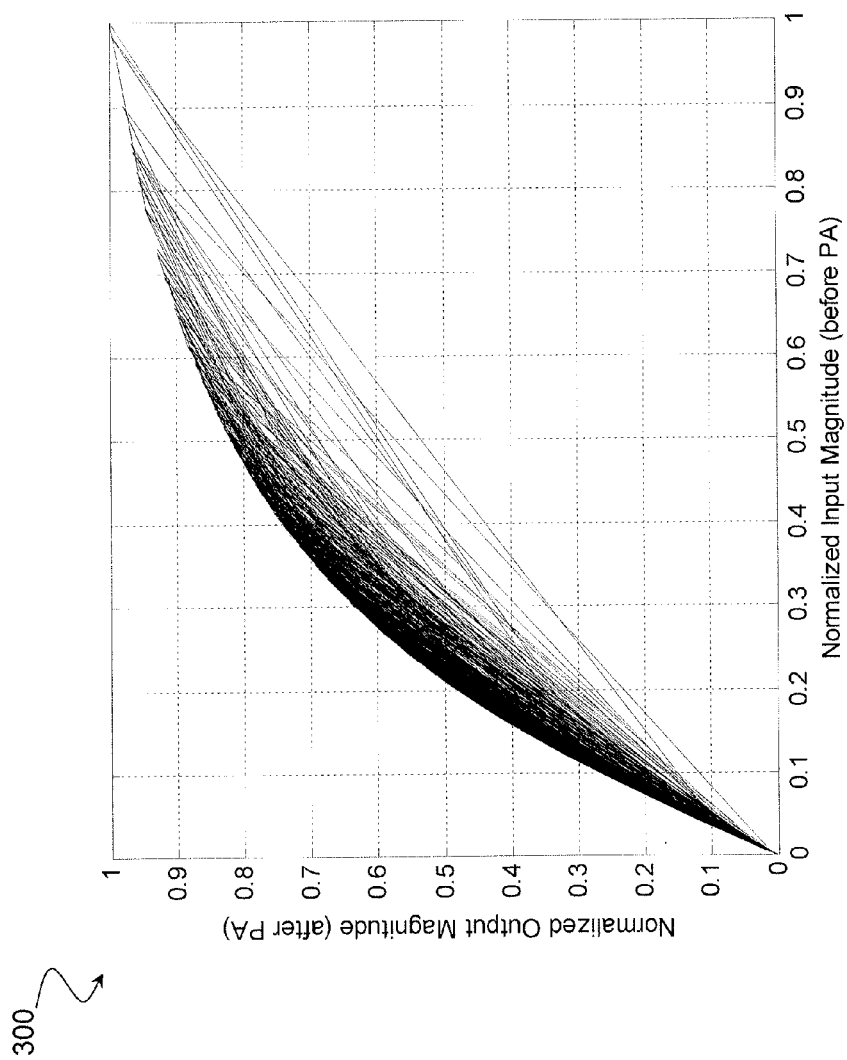
FIG. 3 shows a typical AM/AM curve for a power amplifier.
Figure 4:
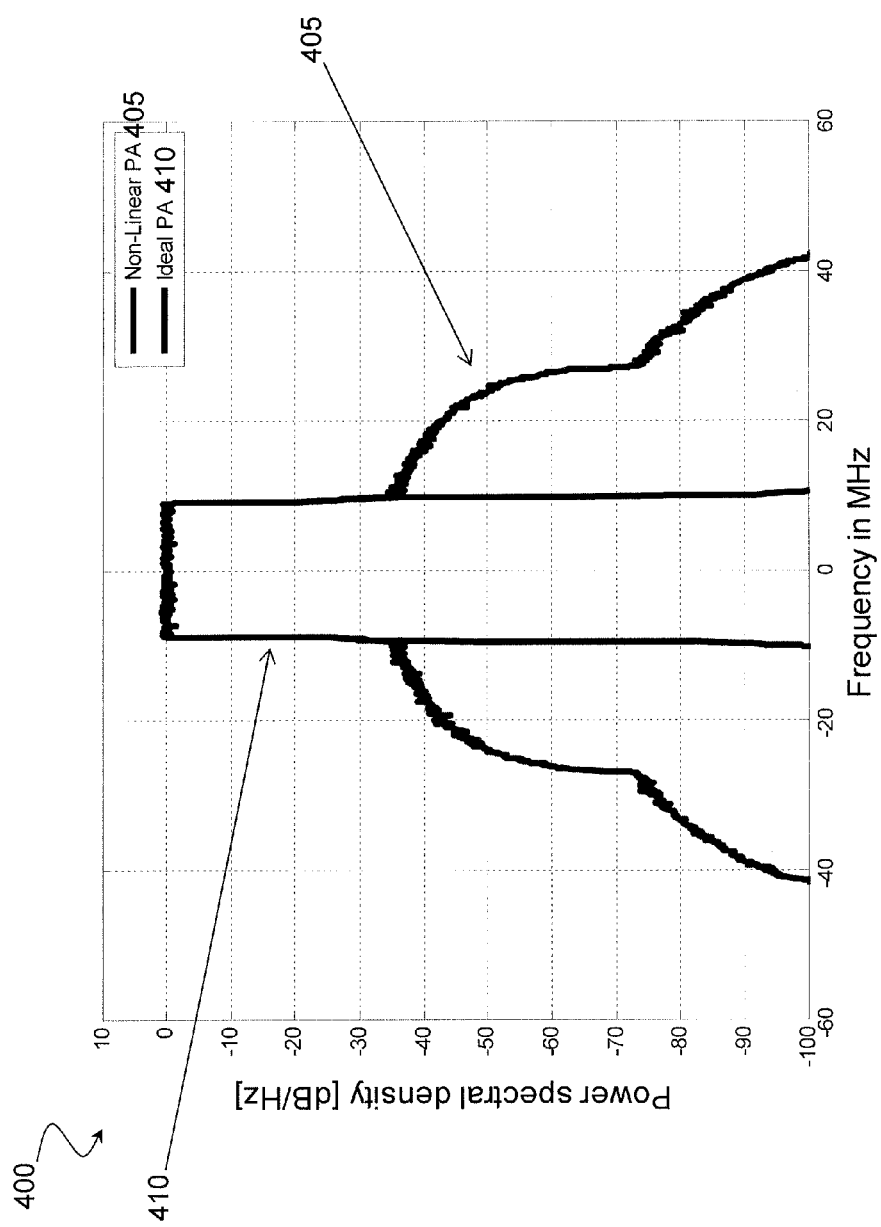
FIG. 4 shows spectral regrowth due to power amplifier non-linearity.
Figure 5:
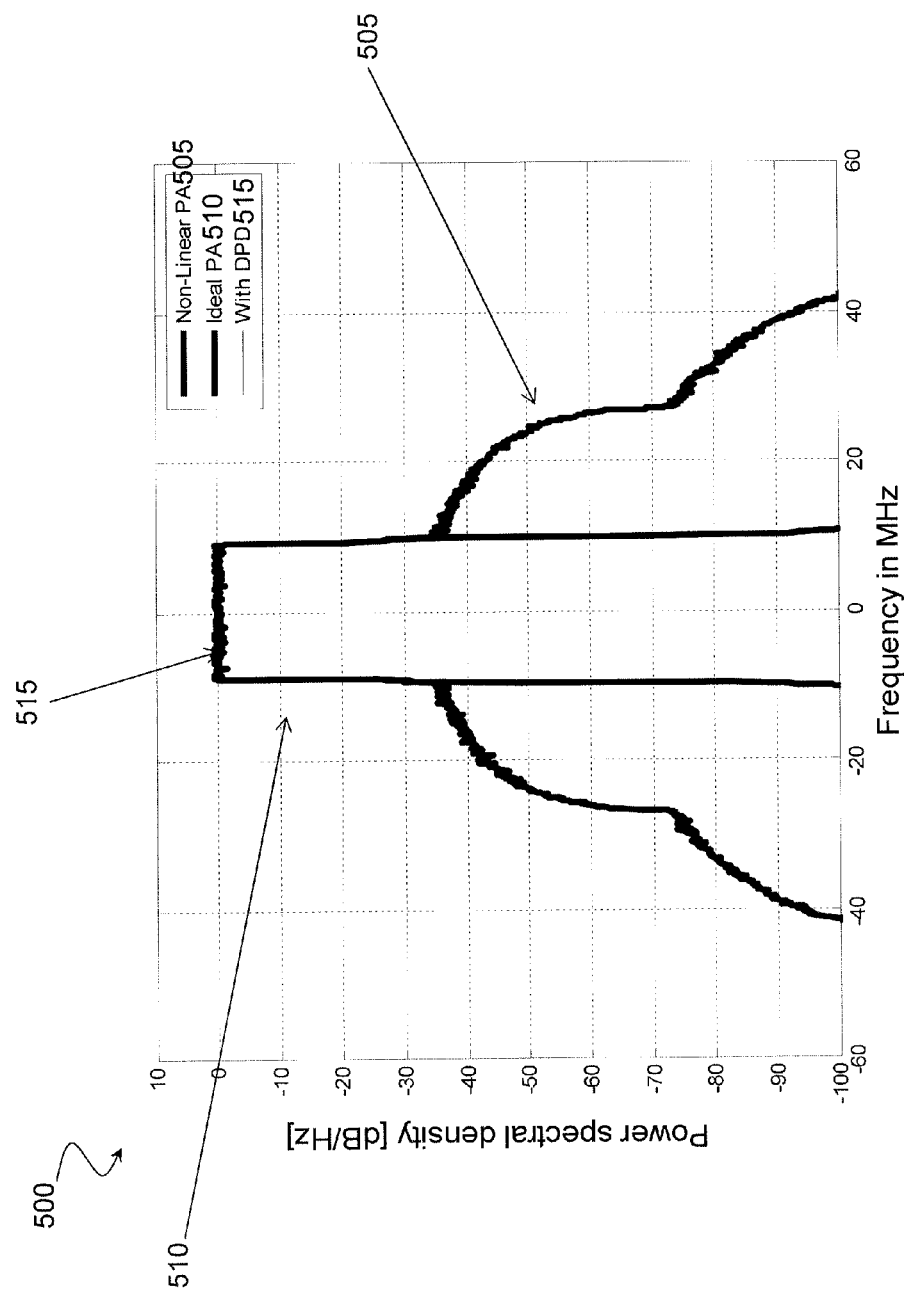
FIG. 5 shows spectral regrowth with DPD.
Figure 6:
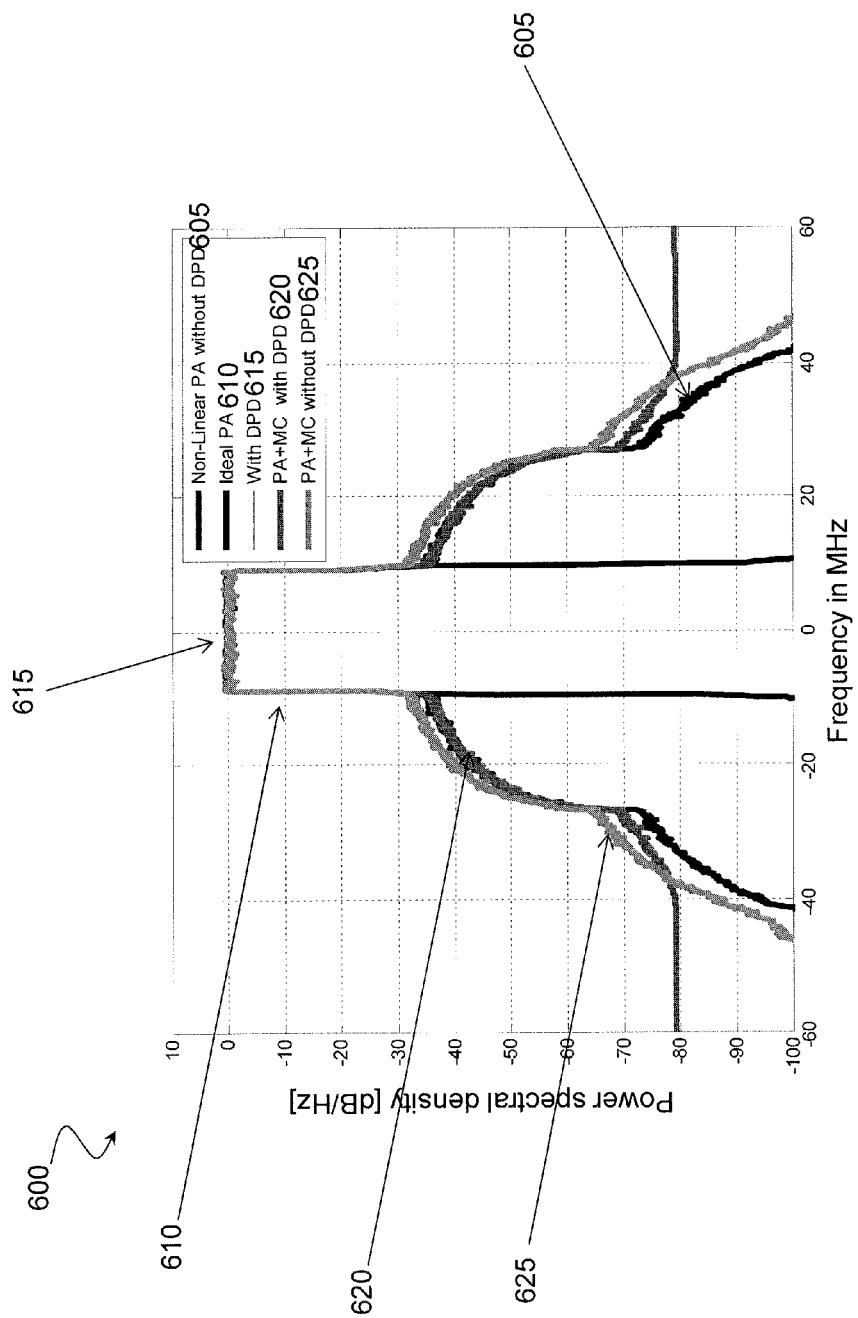
FIG. 6 shows spectral regrowth due to mutual coupling in addition to non-linear power amplification per each antenna element.
Figure 7:
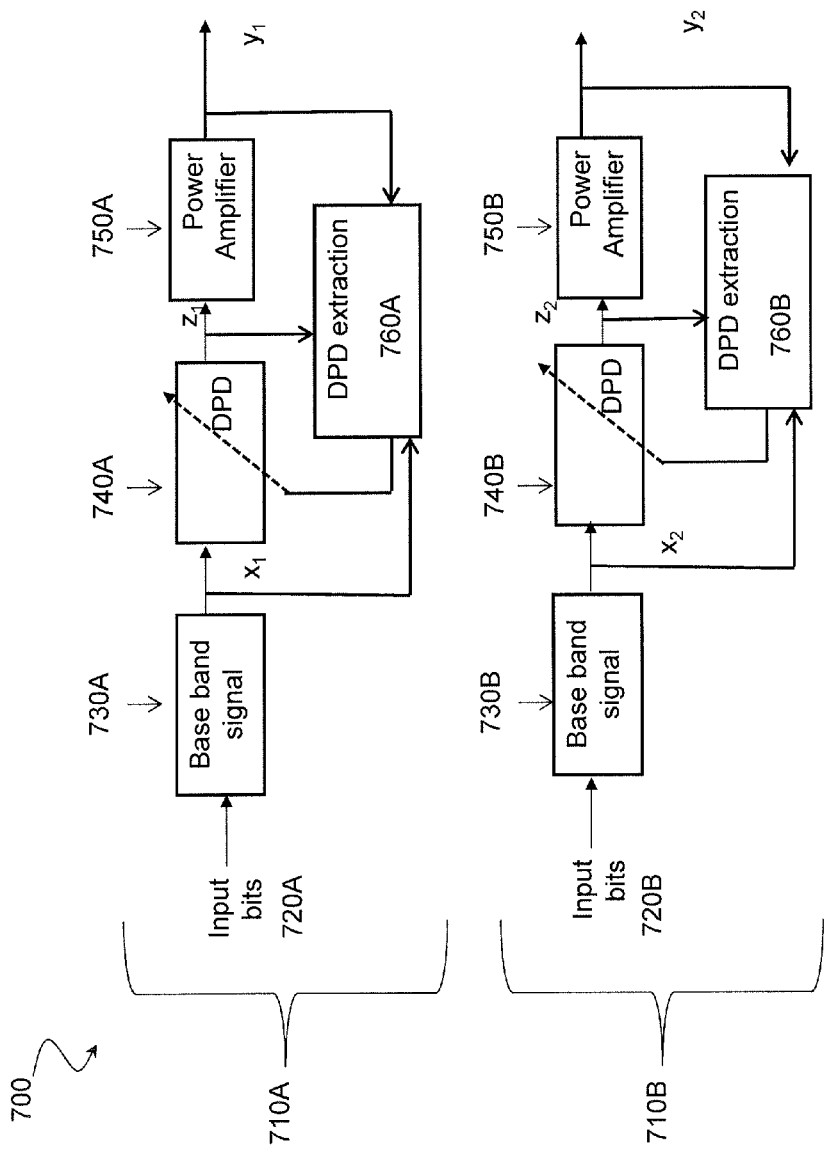
FIG. 7 is a block diagram of a MIMO transmitter, in accordance with certain embodiments.

FIG. 7 is a block diagram of a MIMO transmitter 700, in accordance with certain embodiments. Transmitter 700 includes two transmitter antennas 710A and 710B. Although FIG. 7 only illustrates two transmitter antennas 710A and 710B, the present disclosure contemplates that transmitter 700 may include any suitable number of antennas. Transmitter antennas 710A and 710B receive input bits 720A and 720B, respectively. Transmitter antenna 710A includes baseband signal 730A, DPD module 740A, power amplifier 750A, and DPD extraction module 760A. Transmitter antenna 710B has a similar arrangement, and includes baseband signal 730B, DPD module 740B, power amplifier 750B, and DPD extraction module 760B.

Baseband signals 730A and 730B may originate from a baseband processing unit of an AAS, such as baseband processing unit 210 of AAS 200 described above. DPD modules 740A and 740B may apply digital pre-distortion techniques to compensate for the non-linearity of power amplifiers 750A and 750B, respectively, by distorting the input signal to power amplifiers 750A and 750B such that the output signal from the power amplifier is transformed to be close to what it would have been if the power amplifier would have been linear.

FIG. 7 also illustrates a plurality of signals x1, x2, y1, y2, z1, and z2. Signals x1 and x2 are the output signals from the baseband signals 730A and 730B of antenna branches 710A and 710B, respectively. Signal y1 is the output signal at the output of power amplifier 750A and the antenna (since it is AAS), and y2 is the output signal at the output of the power amplifier 750B and the antenna. Signals z1 and z2 are the input signals to power amplifiers 750A and 750B, respectively. Note that, in this model, we consider only the impact due to non-linear power amplifiers. In practical systems, power amplifiers 750A and 750B may be preceded by many other blocks such as a digital to analog converter (DAC), a local oscillator (LO), or any other suitable components. The output signals y1 and y2 can be expressed as:

$$y_1 = f_1(z_1),$$

$$y_2 = f_2(z_2),$$

where f1 (.) and f2 (.) are non-linear functions that characterize the individual power amplifiers 750A and 750B, respectively. The functions characterizing the individual power amplifiers may be any suitable function. For example, in certain embodiments the function may be one of a polynomial, Hammerstein, Wiener, parallel Hammerstein, RBFNN, and the Volterra series. With DPD, the above equations can be written as:

$$y_1 = f_1(g_1(x_1)),$$

$$y_2 = f_2(g_2(x_2)),$$

where $g_1(.)$ and $g_2(.)$ are the functions that characterize the individual DPD blocks 740A and 740B, respectively. Note that DPD extraction blocks are chosen such that:

$$y_1 = f_1(g_1(x_1)) = G_1 \cdot x_1,$$

$$y_2 = f_2(g_2(x_2)) = G_2 \cdot x_2,$$

where G1 and G2 are the individual gains of each power amplifier 750A and 750B, respectively. It can be seen from the above equations that if g1 and g2 are properly chosen, then the output of power amplifiers 750A and 750B is linear.

When there is mutual coupling between antenna branches 710A and 710B, these calculations must be adjusted. For example, consider the above scenario when there is mutual coupling between antenna branches 710A and 710B. $M_1$ is the coupling coefficient (leakage metric) from the second antenna branch 710B to the first antenna branch 710A, and $M_2$ is the coupling coefficient from the first antenna branch 710A to the second antenna branch 710B. Then the output of power amplifiers 750A and 750B can be expressed as:

$$y_1 = f_1(g_1(x_1) + M_1 y_2) \neq G_1 \cdot x_1,$$

$$y_2 = f_2(g_2(x_2) + M_2 y_1) \neq G_2 \cdot x_2$$

Thus, it can be seen that when there is mutual coupling between antenna elements 710A and 710B, DPD techniques may fail.

Figure 8:
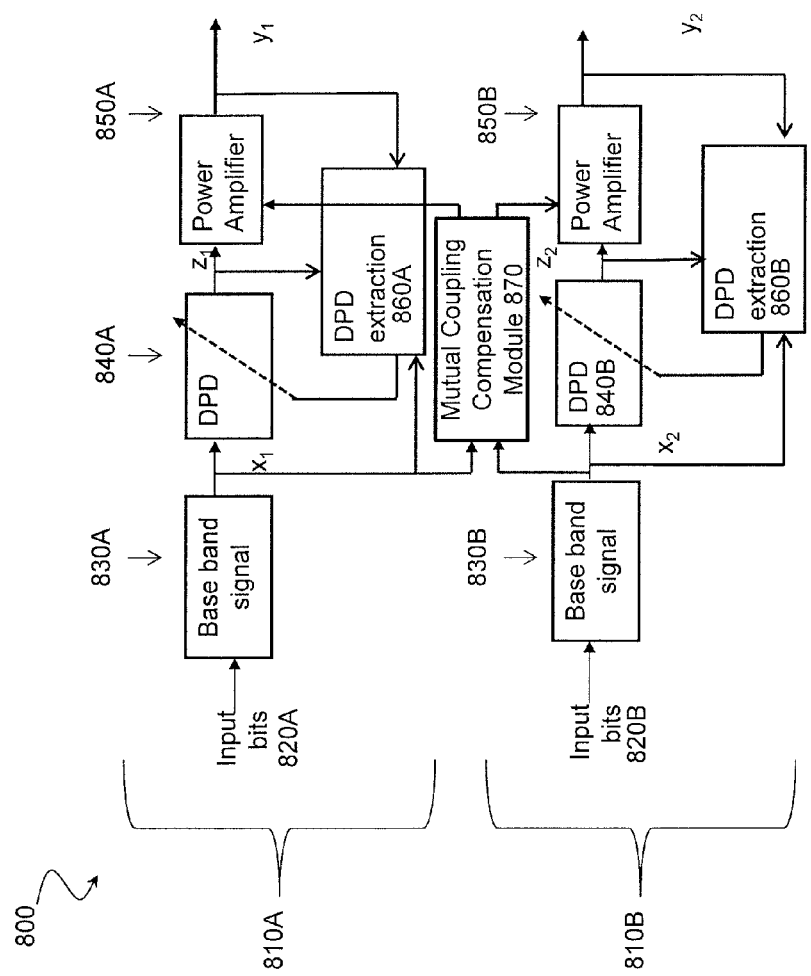
FIG. 8 is a block diagram illustrating a proposed structure for compensating mutual coupling effects, in accordance with certain embodiments.

FIG. 8 is a block diagram illustrating a proposed structure for compensating mutual coupling effects, in accordance with certain embodiments. Similar to FIG. 7, antenna system 800 includes two transmitter antennas 810A and 810B. Transmitter antennas 810A and 810B may receive input bits 820A and 820B, respectively. Transmitter antenna 810A includes baseband signal 830A, DPD module 840A, power amplifier 850A, and DPD extraction module 860A. Transmitter antenna 810B includes a similar arrangement, including baseband signal 830B, DPD module 840B, power amplifier 850B, and DPD extraction module 860B. FIG. 8 also includes mutual coupling compensation module 870.

To address the impact of mutual coupling on DPD techniques, certain embodiments include mutual coupling compensation module 870 such that at each branch 810A and 810B the output of the signals from power amplifiers 850A and 850B can be written as:

$$y_1 = f_1(g_1(x_1) + M_1 y_2 + A_1 x_2),$$

$$y_2 = f_2(g_2(x_2) + M_2 y_1 + A_2 x_1),$$

where compensation coefficients A1 and A2 are constants which satisfy the following criteria:

$$y_1 = f_1(g_1(x_1) + M_1 y_2 + A_1 x_2) = f_1(g_1(x_1)),$$

$$y_2 = f_2(g_2(x_2) + M_2 y_1 + A_2 x_1) = f_2(g_2(x_2))$$

It can be seen from the above equations that with the right choices of compensation coefficients A1 and A2, we can linearize power amplifiers 850A and 850B and compensate the mutual coupling coefficients with DPD techniques. In certain embodiments, mutual coupling module 870 takes input signals x1 and x2 from baseband signals 830A and 830B, respectively. Mutual coupling module 870 produces an output based on the compensation coefficients A1 and A2 described in the equations above. These output signals are output to power amplifiers 850A and 850B. Compensation coefficients A1 and A2 may be selected in any suitable manner, a variety of which are described in further detail below. Although FIG. 8 illustrates a two transmitter antenna system, the present disclosure contemplates that the various embodiments may be applied to antenna systems having a higher number of antennas.

To efficiently compensate for mutual coupling effects, the compensation coefficients A1 and A2 need to be determined. The present disclosure contemplates various embodiments for determining compensation coefficients A1 and A2. As one example, compensation coefficients A1 and A2 may be determined as a static computation. As another example, compensation coefficients A1 and A2 may be determined dynamically. As yet another example, compensation coefficients A1 and A2 may be determined using a combination of the static and dynamic computation techniques. The various embodiments are described in further detail below.

In some embodiments, the compensation coefficients A1 and A2 may be determined as a static value. For example, the coupling coefficients $M_1$ and $M_2$ described above may be estimated in a lab environment, and the compensation coefficients A1 and A2 may be set relative to coupling coefficients $M_1$ and $M_2$, respectively. For example, let $M_1^{est}$ be the estimated mutual coupling coefficient from antenna branch 810B to antenna branch 810A and $M_2^{est}$ be the estimated mutual coupling coefficient from antenna branch 810A to antenna branch 810B. Thus, when determining compensation coefficients A1 and A2 as static values, A1 and A2 can be set as:

$$A1 = -M_1^{est},$$

$$A2 = -M_2^{est}$$

The determined compensation coefficients A1 and A2 can then be applied as described above to compensate for mutual coupling between antenna branches 810A and 810B.

Figure 9:
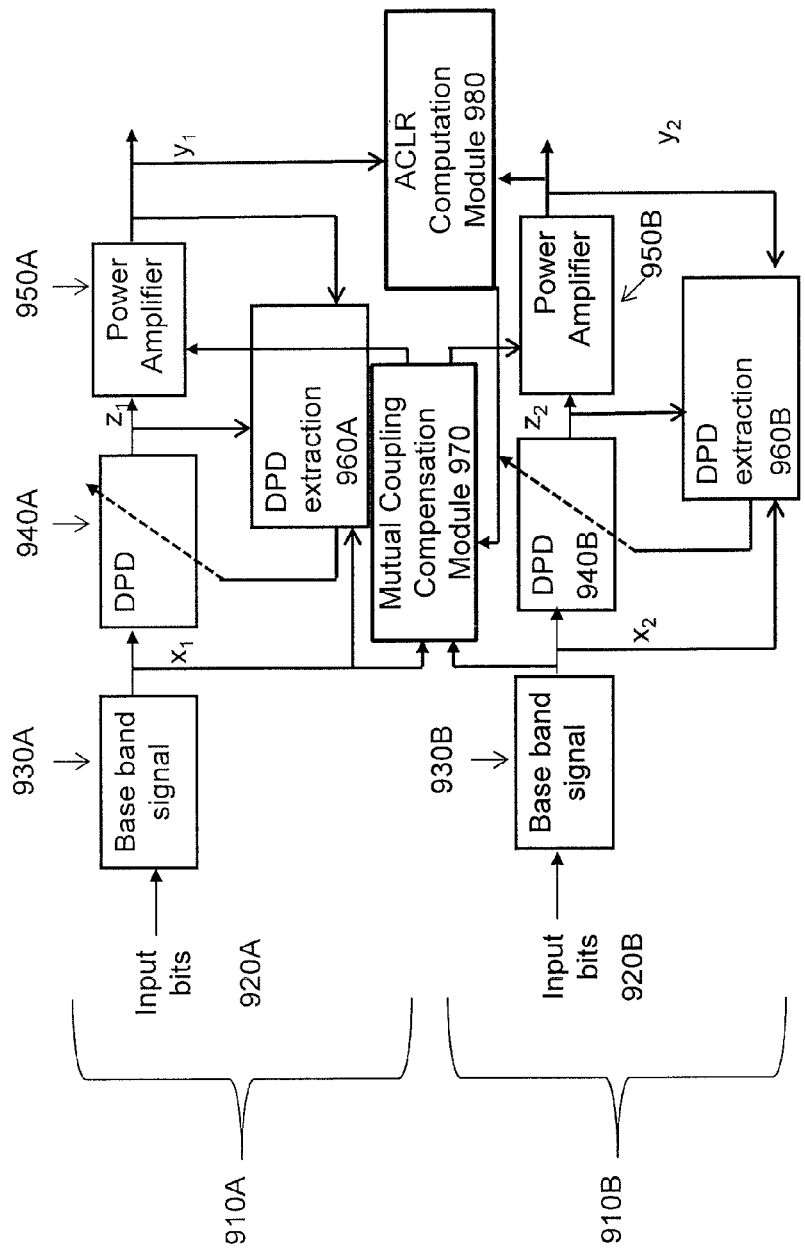
FIG. 9 is a block diagram of a proposed structure for compensating mutual coupling effects with dynamic update of compensation coefficients, in accordance with certain embodiments.

In certain embodiments, the compensation coefficients A1 and A2 may be computed dynamically or iteratively. FIG. 9 is a block diagram of a proposed structure for compensating mutual coupling effects with dynamic update of compensation coefficients, in accordance with certain embodiments. Similar to FIG. 8, FIG. 9 illustrates antenna system 900 that includes two transmitter antennas 910A and 910B. Transmitter antenna 910A and 910B may receive input bits 920A and 920B, respectively. Transmitter 910A includes baseband signal 930A, DPD module 940A, power amplifier 950A, and DPD extraction module 960A. Transmitter antenna 910B includes a similar arrangement, including baseband signal 930B, DPD module 940B, power amplifier 950B, and DPD extraction module 960B. Antenna system 900 also includes mutual coupling compensation module 970. FIG. 9 also includes ACLR computation module 980. ACLR compensation module 980 may measure the ACLR of power amplifiers 950A and 950B, and use these measurements to compute compensation coefficients A1 and A2.

In certain embodiments, the compensation coefficients A1 and A2 may be computed dynamically or iteratively based on the output signals y1 and y2 of power amplifiers 950A and 950B, respectively. In dynamically determining the compensation coefficients A1 and A2, the values of compensation coefficients A1 and A2 may be controlled by the output ACLR. In certain embodiments, iterative techniques can be used to compute the coefficients. For example, ACLR compensation module 980 may perform the steps of an algorithm to dynamically compute compensation coefficients A1 and A2. Initially, ACLR compensation module 980 may initialize the compensation coefficients A1 and A2 to 1.0 and 0.0, respectively. ACLR compensation module 980 may then measure the outputs y1 and y2 of antenna branches 910A and 910B, respectively. ACLR compensation module 980 may then determine whether the ACLR is less than an ACLR threshold. In certain embodiments, the ACLR threshold may be a fixed threshold. The ACLR threshold may be any suitable threshold. For example, the ACLR threshold may be set to a value of −45 dBc to meet the 3GPP requirements.

If ACLR compensation module 980 determines that the ACLR is less than the ACLR threshold, the algorithm ends. If ACLR compensation module 980 determines that the ACLR is not less than the ACLR threshold, then ACLR compensation module 980 may update compensation coefficients A1 and A2. Having updated compensation coefficients A1 and A2, ACLR compensation module 980 may again measure the outputs y1 and y2 of antenna branches 910A and 910B, respectively, and determine whether the ACLR is less than an ACLR threshold. This process may repeat until the determined compensation coefficients A1 and A2 result in an ACLR below the ACLR threshold.

In certain embodiments, the static and dynamic approaches to determining compensation coefficients A1 and A2 may be combined. As described above, $M_1^{est}$ may be the estimated mutual coupling coefficient from antenna branch 910B to antenna branch 910A, and $M_2^{est}$ may be the estimated mutual coupling coefficient from antenna branch 910A to antenna branch 910B. The estimated values $M_1^{est}$ and $M_2^{est}$ may be used to initialize the compensation coefficients as described. ACLR computation module 980 may then proceed through its algorithm as described above. Combining the static and dynamic approaches for determining compensation coefficients A1 and A2 may be advantageous, allowing the compensation coefficients A1 and A2 to be initialized to estimated values, which may be more accurate.

As described above, the various embodiments described herein may be applied to scenarios in which there are more than two transmitter antennas per antenna system. As the number of transmitter antennas per antenna system increases, so does the computational complexity in computing the compensation coefficients described above. To illustrate, assume the number of transmit antennas is $N_t$. If some of the embodiments described above are applied to such an antenna system, the following equations could be solved to compensate the mutual coupling effects:

$$y_1 = f_1\left(g_1(x_1) + \sum_{i=2}^{N_t} M_i y_i + \sum_{i=2}^{N_t} A_i x_i\right) = f_1(g_1(x_1)),$$

$$y_2 = f_2\left(g_2(x_2) + \sum_{i=1,i\neq 2}^{Nt} M_i y_i + \sum_{i=1,i\neq 2}^{Nt} A_i x_i\right) = f_2(g_2(x_2))$$

...

...

$$y_{Nt} = f_{Nt}\left(g_{Nt}(x_{Nt}) + \sum_{i=1,i\neq Nt}^{Nt} M_i y_i + \sum_{i=1,i\neq 2}^{Nt} A_i x_i\right) = f_{Nt}(g_{Nt}(x_{Nt}))$$

Thus, it can be seen from the above equations that the complexity involved in computing the compensation coefficients Ai is very large. Certain embodiments may reduce the computational complexity that arises due to increasing the number of transmitter antennas in an antenna system.

The effects of mutual coupling are very small if the distance between elements is very large. In certain embodiments, the compensation coefficients compensating for the effects of mutual coupling from antenna branches separated by distances greater than or equal to a threshold distance may not be used and/or updated in computing the compensation coefficients (Ai). To illustrate, assume that $N_t=4$, and the antennas are arranged in a uniform linear array. Assume further that the distance between two adjacent elements is $0.5\lambda$, where $\lambda$ is the wavelength. In certain embodiments, in computing the compensation coefficients Ai, we can neglect the terms if the distance is greater than $1.0\lambda$. Thus, in one embodiment, the following equations may be used to determine Ai:

$$y_1 = f_1\left(g_1(x_1) + \sum_{i=2}^{4} M_i y_i + \sum_{i=2}^{3} A_i x_i\right) = f_1(g_1(x_1)),$$

$$y_2 = f_2\left(g_2(x_2) + \sum_{i=1,i\neq 2}^{4} M_i y_i + A_1 x_1 + A_3 x_3\right) = f_2(g_2(x_2))$$

$$y_3 = f_3\left(g_3(x_3) + \sum_{i=1,i\neq 3}^{4} M_i y_i + A_2 x_2 + A_4 x_4\right) = f_3(g_3(x_3))$$

$$y_4 = f_4\left(g_4(x_4) + \sum_{i=1,i\neq 4}^{4} M_i y_i + A_2 x_2 + A_3 x_3\right) = f_4(g_4(x_4))$$

As can be seen from the above equations, the contribution of the terms whose distance is greater than $1.0\lambda$ is neglected. Thus, the overall complexity of the compensation coefficient calculations may be dramatically reduced as the number of antenna branches increases.

Figure 10:
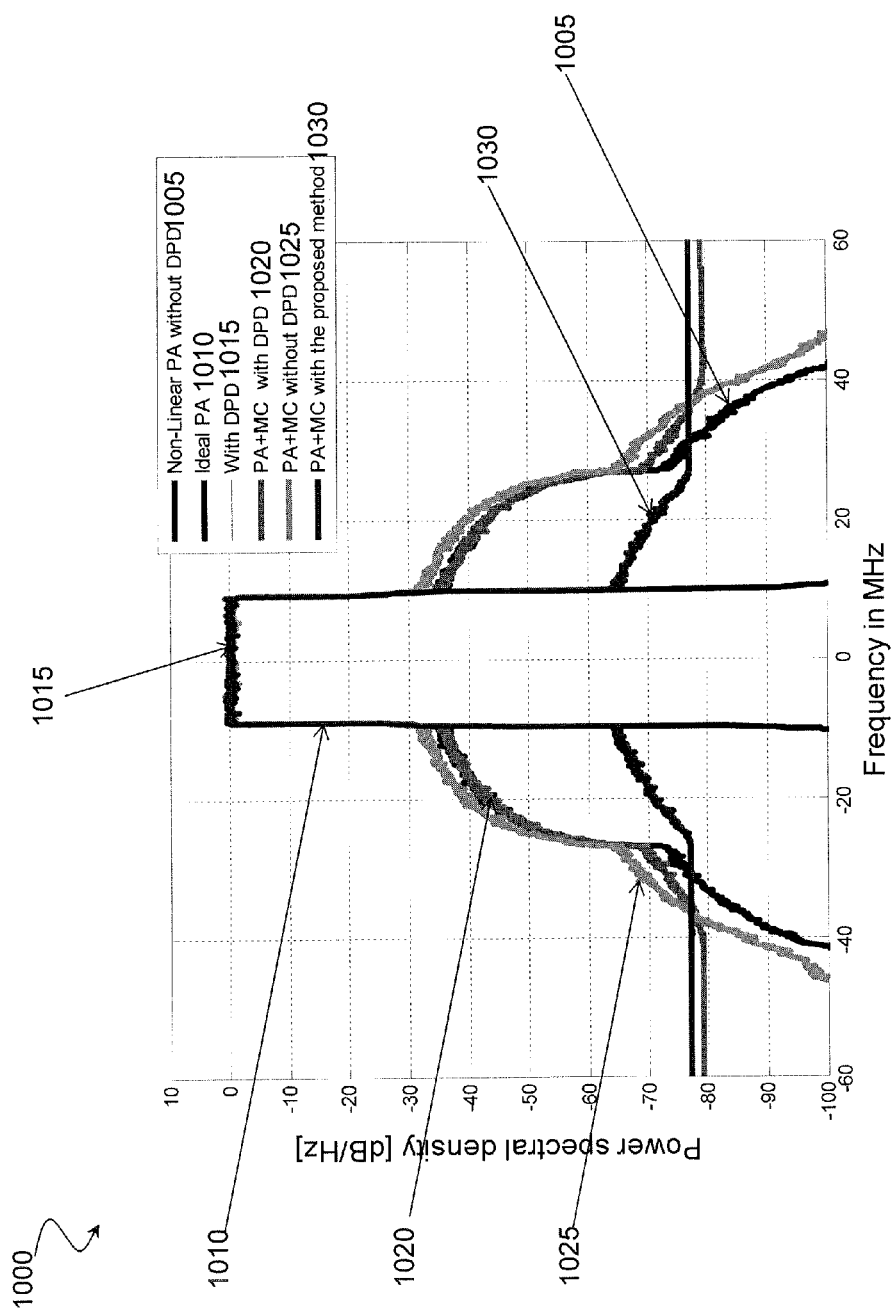
FIG. 10 shows power spectral density when a proposed structure for compensating mutual coupling effects is used, in accordance with certain embodiments.

FIG. 10 shows power spectral density when a proposed structure for compensating mutual coupling effects is used, in accordance with certain embodiments. More particularly, graph 1000 illustrates power spectral density plots for non-linear power amplification without DPD 1005, ideal power amplification 1010, non-linear power amplification with DPD 1015, power amplification and mutual coupling with DPD 1020, power amplification and mutual coupling without DPD 1025, and power amplification with mutual coupling where the mutual coupling has been compensated for in accordance with the proposed embodiments 1030. It can be seen from FIG. 10 that using the disclosed embodiments, the ACLR can be reduced to −65 dBc.

Figure 11:
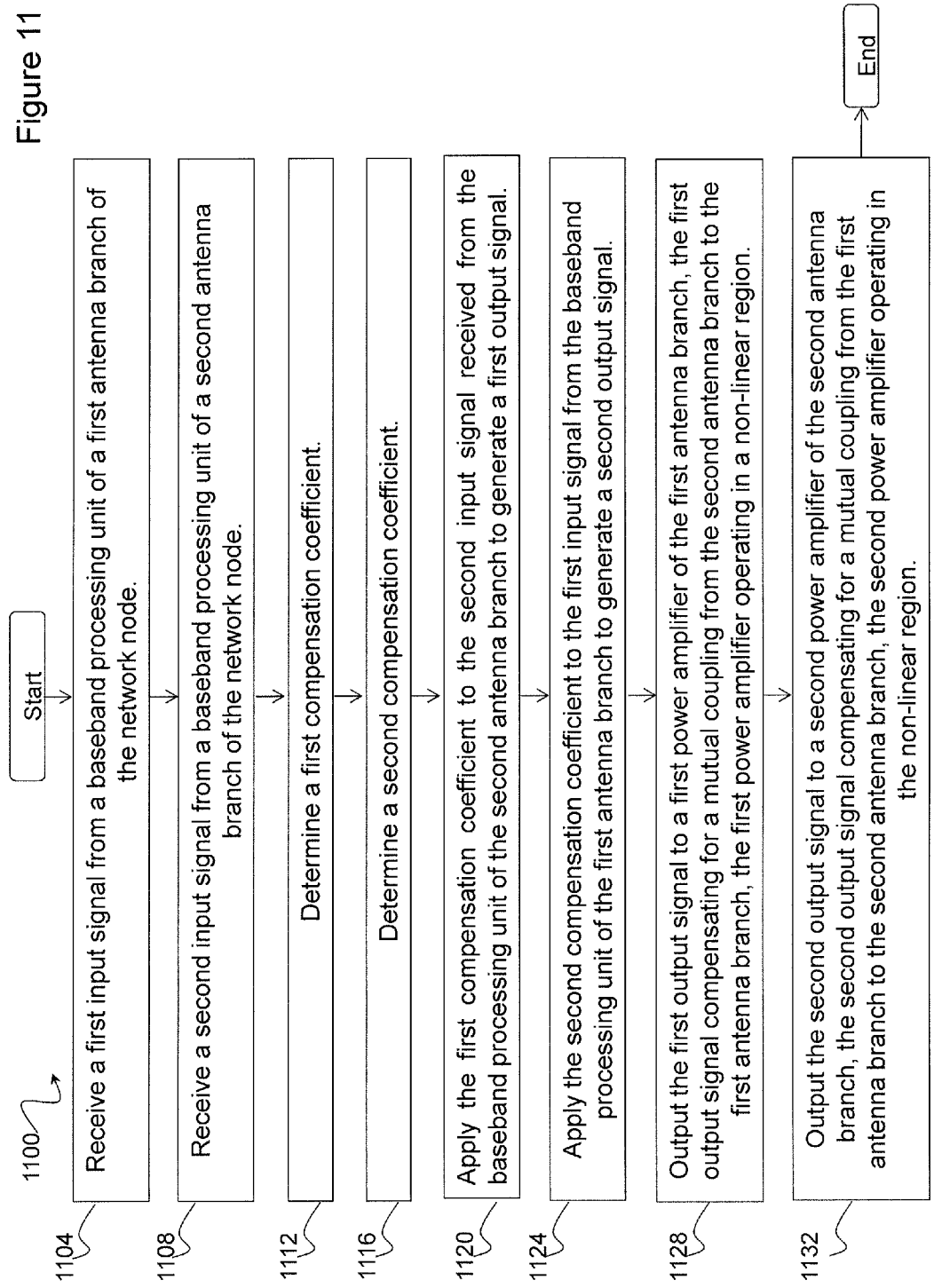
FIG. 11 is a flow chart of a method in a network node, in accordance with an embodiment.

FIG. 11 is a flow chart of a method in a network node, in accordance with an embodiment. At step 1104, the network node receives a first input signal from a baseband processing unit of a first antenna branch of the network node. The network node may be an active-array-antenna system base station. At step 1108, the network node receives a second input signal from a baseband processing unit of a second antenna branch of the network node. In certain embodiments, the baseband processing unit of the first antenna branch and the baseband processing unit of the second antenna branch may be the same.

At step 1112, the network node determines a first compensation coefficient. At step 1116, the network node determines a second compensation coefficient. In certain embodiments, the first compensation coefficient and the second compensation coefficient may be predefined. The first compensation coefficient may be based at least in part on an estimation of a mutual coupling from the second antenna branch to the first antenna branch. The second compensation coefficient may be based at least in part on an estimation of a mutual coupling from the first antenna branch to the second antenna branch.

In certain embodiments, the steps of determining the first compensation coefficient and determining the second compensation coefficient may include setting the first compensation coefficient to a first value, setting the second compensation coefficient to a second value, measuring an adjacent channel leakage power ratio based at least in part on a first power amplifier output from the first power amplifier and a second power amplifier output from the second power amplifier, determining whether the adjacent channel leakage power ratio is less than an adjacent channel leakage power ratio threshold, and adjusting the first compensation coefficient and the second compensation coefficient upon determining that the adjacent channel leakage power ratio is more than the adjacent channel leakage power ratio threshold. The first value may be based at least in part on an estimation of a mutual coupling from the second antenna branch to the first antenna branch, and the second value may be based at least in part on an estimation of a mutual coupling from the first antenna branch to the second antenna branch. The adjacent channel leakage power ratio threshold may be approximately −45 dBc.

At step 1120, the network node applies the first compensation coefficient to the second input signal received from the baseband processing unit of the second antenna branch to generate a first output signal. At step 1124, the network node applies the second compensation coefficient to the first input signal received from the baseband processing unit of the first antenna branch to generate a second output signal.

At step 1128, the network node outputs the first output signal to a first power amplifier of the first antenna branch, the first output signal compensating for a mutual coupling from the second antenna branch to the first antenna branch, the first power amplifier operating in a non-linear region. The mutual coupling from the second antenna branch to the first antenna branch may be a leakage signal power from the second power amplifier that is leaked in a backward direction and passes through the first power amplifier without being transformed by the one or more pre-distortion techniques. At step 1132, the network node outputs the second output signal to a second power amplifier of the second antenna branch, the second output signal compensating for a mutual coupling from the first antenna branch to the second antenna branch, the second power amplifier operating in the non-linear region. The mutual coupling from the first antenna branch to the second antenna branch comprises a leakage signal power from the first power amplifier that is leaked in a backward direction and passes through the second power amplifier without being transformed by the one or more pre-distortion techniques In certain embodiments, the network node may apply one or more pre-distortion techniques to transform a first output signal of the baseband processing unit of the first antenna branch to compensate for a non-linearity of the first power amplifier, the first output signal of the baseband processing unit of the first antenna branch corresponding to the first input signal. The network node may apply the one or more pre-distortion techniques to transform a second output signal of the baseband processing unit of the second antenna branch to compensate for a non-linearity of the second power amplifier, the second output signal of the baseband processing unit of the second antenna branch corresponding to the second input signal. The pre-distortion technique may include one of digital pre-distortion techniques and analog pre-distortion techniques.

In certain embodiments, the first antenna branch and the second antenna branch are two of a plurality of antenna branches of an antenna array of the network node, each of the plurality of antenna branches of the antenna array separated from each other by a distance, and compensation coefficients are only determined for pairs of antenna branches separated by a threshold distance or less.

Figure 12:
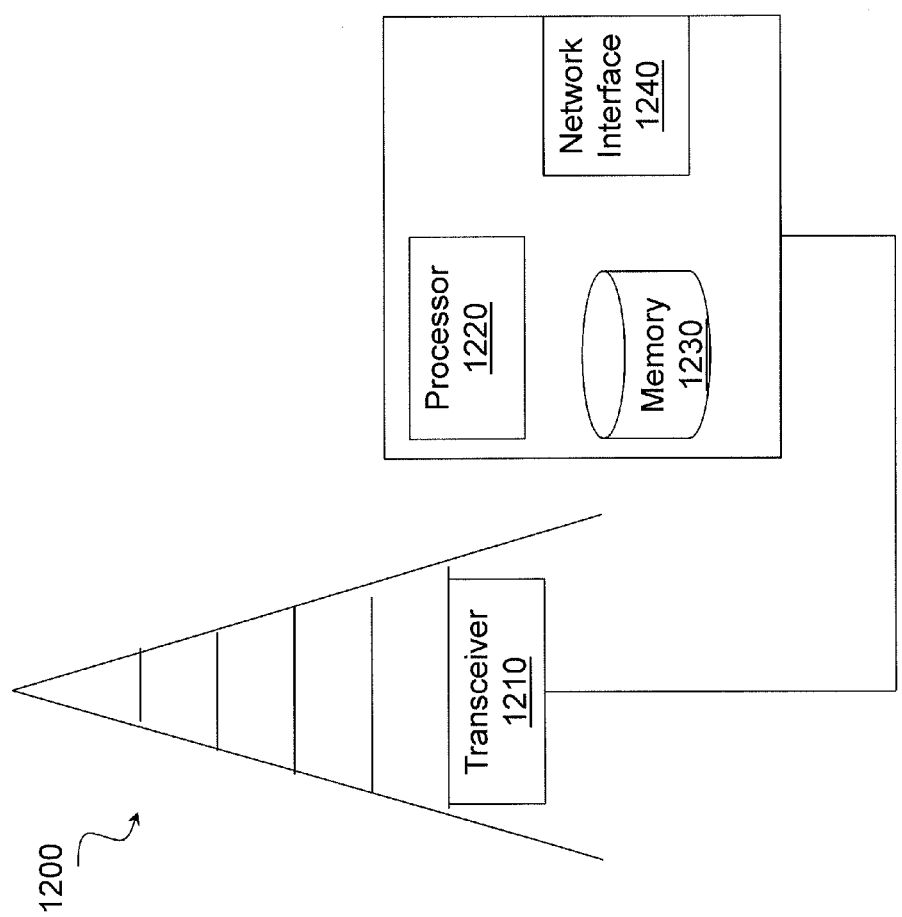
FIG. 12 is a block schematic of an exemplary radio network node, in accordance with certain embodiments.

FIG. 12 is a block schematic of an exemplary network node 1200, in accordance with certain embodiments. Network node 1200 may be any type of radio network node or any network node that communicates with a wireless device (e.g., user equipment (UE), station, terminal) and/or with another network node. Examples of network node 1200 include an eNodeB, a nodeB, a base station, a wireless access point (e.g., a Wi-Fi access point), a low power node, a base transceiver station (BTS), relay, donor node controlling relay, transmission points, transmission nodes, remote RF unit (RRU), remote radio head (RRH), multi-standard radio (MSR) radio node such as MSR BS, nodes in distributed antenna system (DAS), O&M, OSS, SON, positioning node (e.g., E-SMLC), MDT, or any other suitable network node. Network node 1200 may be a network node having an active antenna array system, such as an active-array-antenna system base station, having any suitable number of antenna branches. Network nodes 1200 may be deployed throughout a network as a homogenous deployment, heterogeneous deployment, or mixed deployment. A homogeneous deployment may generally describe a deployment made up of the same (or similar) type of network nodes 1200 and/or similar coverage and cell sizes and inter-site distances. A heterogeneous deployment may generally describe deployments using a variety of types of network nodes 1200 having different cell sizes, transmit powers, capacities, and inter-site distances. For example, a heterogeneous deployment may include a plurality of low-power nodes placed throughout a macro-cell layout. Mixed deployments may include a mix of homogenous portions and heterogeneous portions.

Network node 1200 may include one or more of transceiver 1210, processor 1220, memory 1230, and network interface 1240. In some embodiments, transceiver 1210 facilitates transmitting wireless signals to and receiving wireless signals from one or more wireless devices (e.g., via an antenna), processor 1220 executes instructions to provide some or all of the functionality described above as being provided by a network node 1200, memory 1230 stores the instructions executed by processor 1220, and network interface 1240 communicates signals to backend network components, such as a gateway, switch, router, Internet, Public Switched Telephone Network (PSTN), one or more core network nodes, radio network controllers, or any other suitable components.

Processor 1220 may include any suitable combination of hardware and software implemented in one or more modules to execute instructions and manipulate data to perform some or all of the described functions of network node 1200. In some embodiments, processor 1220 may include, for example, one or more computers, one or more central processing units (CPUs), one or more microprocessors, one or more applications, and/or other logic.

Memory 1230 is generally operable to store instructions, such as a computer program, software, an application including one or more of logic, rules, algorithms, code, tables, etc. and/or other instructions capable of being executed by a processor. Examples of memory 1230 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 1240 is communicatively coupled to processor 1220 and may refer to any suitable device operable to receive input for network node 1200, send output from network node 1200, perform suitable processing of the input or output or both, communicate to other devices, or any combination of the preceding. Network interface 1240 may include appropriate hardware (e.g., port, modem, network interface card, etc.) and software, including protocol conversion and data processing capabilities, to communicate through a network.

In certain embodiments, network node 1200 may include a mutual coupling compensation module, an ACLR computation module, a DPD module, a DPD extraction module, a communication module, a receiving module, a determining module, and any other suitable modules. In some embodiments, one or more of the mutual coupling compensation module, ACLR computation module, communication module, receiving module, determining module, or any other suitable module may be implemented using one or more processors 1220 of FIG. 12.

The mutual coupling compensation module may receive a first input signal from a baseband processing unit of a first antenna branch of the network node. The mutual coupling compensation module may receive a second input signal from a baseband processing unit of a second antenna branch of the network node. In certain embodiments, the mutual coupling compensation module may determine a first compensation coefficient and a second compensation coefficient. The mutual coupling compensation module may apply the first compensation coefficient to the second input signal received from the baseband processing unit of the second antenna branch to generate a first output signal. The mutual coupling compensation module may apply the second compensation coefficient to the first input signal received from the baseband processing unit of the first antenna branch to generate a second output signal. The mutual coupling compensation module may output the first output signal to a first power amplifier of the first antenna branch, the first output signal compensating for a mutual coupling from the second antenna branch to the first antenna branch, the first power amplifier operating in a non-linear region, and output the second output signal to a second power amplifier of the second antenna branch, the second output signal compensating for a mutual coupling from the first antenna branch to the second antenna branch, the second power amplifier operating in the non-linear region.

The ACLR computation module may determine a first compensation coefficient and a second compensation coefficient. In determining the first compensation coefficient and the second compensation coefficient, the ACLR computation module may set the first compensation coefficient to a first value, set the second compensation coefficient to a second value, and measure an adjacent channel leakage power ratio based at least in part on a first power amplifier output from the first power amplifier and a second power amplifier output from the second power amplifier. The ACLR computation module may determine whether the adjacent channel leakage power ratio is less than an adjacent channel leakage power ratio threshold, and adjust the first compensation coefficient and the second compensation coefficient upon determining that the adjacent channel leakage power ratio is more than the adjacent channel leakage power ratio threshold.

In general, the DPD module may apply digital pre-distortion techniques to one or more signals, and the DPD extraction module may perform DPD extraction. The communication module may perform the transmission functions of network node 1200. The communication module may transmit messages to one or more wireless devices. The communication module may include a transmitter and/or a transceiver, such as transceiver 1210. The communication module may include circuitry configured to wirelessly transmit messages and/or signals. In particular embodiments, the communication module may receive messages and/or signals for transmission from the determining module or any other module.

The receiving module may perform the receiving functions of network node 1200. The receiving module may receive any suitable information from a wireless device. The receiving module may include a receiver and/or a transceiver. The receiving module may include circuitry configured to wirelessly receive messages and/or signals. In particular embodiments, the receiving module may communicate received messages and/or signals to the determining module or any other module.

The determining module may perform the processing functions of network node 1200. For example, in certain embodiments, the determining module may perform the functions of one or more of the mutual coupling compensation module or ACLR computation module. In certain embodiments, the functions of two or more of the various modules may be combined into a single module.

Other embodiments of network node 1200 may include additional components beyond those shown in FIG. 12 that may be responsible for providing certain aspects of the radio network node's functionality, including any of the functionality described above and/or any additional functionality (including any functionality necessary to support the solutions described above). The various different types of network nodes may include components having the same physical hardware but configured (e.g., via programming) to support different radio access technologies, or may represent partly or entirely different physical components.

Modifications, additions, or omissions may be made to the systems and apparatuses described herein without departing from the scope of the disclosure. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods described herein without departing from the scope of the disclosure. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

Abbreviations used in the preceding description include:
MIMO Multiple input multiple output
Tx Transmitter
UE User Equipment
TTI Transmit Time Interval
BS Base Station
eNB Evolved NodeB, base station
E-UTRAN Evolved universal terrestrial radio access network
E-UTRA Evolved universal terrestrial radio access
E-UTRA FDD E-UTRA frequency division duplex
E-UTRA TDD E-UTRA time division duplex
LTE Long term evolution
RAT Radio Access Technology
TDD Time division duplex
WLAN Wireless Local Area Network
DL Downlink
SINR Signal-to-Interference Ratio
DPD Digital Predistortion
Im Intermodulation
RF Radio Frequency

The invention claimed is:

1. A method in a network node, comprising:
receiving a first input signal from a first antenna branch baseband processing unit of a first antenna branch of the network node;
receiving a second input signal from a second antenna branch baseband processing unit of a second antenna branch of the network node;
determining a first compensation coefficient;
determining a second compensation coefficient;
applying, using a mutual coupling processor, the first compensation coefficient to the second input signal received from the second antenna branch baseband processing unit to generate a first output signal;
applying, using the mutual coupling processor, the second compensation coefficient to the first input signal received from the first antenna branch baseband processing unit to generate a second output signal;
outputting the first output signal to a first power amplifier of the first antenna branch, the first output signal compensating for a mutual coupling from the second antenna branch to the first antenna branch, the first power amplifier operating in a non-linear region; and
outputting the second output signal to a second power amplifier of the second antenna branch, the second output signal compensating for a mutual coupling from the first antenna branch to the second antenna branch, the second power amplifier operating in the non-linear region.

2. The method of claim 1, further comprising:
applying one or more pre-distortion techniques to transform a first output signal of the first antenna branch baseband processing unit to compensate for a non-linearity of the first power amplifier, the first output signal of the first antenna branch baseband processing unit corresponding to the first input signal;
applying the one or more pre-distortion techniques to transform a second output signal of the second antenna branch baseband processing unit to compensate for a non-linearity of the second power amplifier, the second output signal of the second antenna branch baseband processing unit corresponding to the second input signal.

3. The method of claim 2, wherein the pre-distortion techniques include one of digital pre-distortion techniques and analog pre-distortion techniques.

4. The method of claim 2, wherein:
the mutual coupling from the second antenna branch to the first antenna branch comprises a leakage signal power from the second power amplifier that is leaked in a backward direction and passes through the first power amplifier without being transformed by the one or more pre-distortion techniques; and
the mutual coupling from the first antenna branch to the second antenna branch comprises a leakage signal power from the first power amplifier that is leaked in a backward direction and passes through the second power amplifier without being transformed by the one or more pre-distortion techniques.

5. The method of claim 1, wherein:
the first compensation coefficient and the second compensation coefficient are predefined;
the first compensation coefficient is based at least in part on an estimation of a mutual coupling from the second antenna branch to the first antenna branch; and
the second compensation coefficient is based at least in part on an estimation of a mutual coupling from the first antenna branch to the second antenna branch.

6. The method of claim 1, wherein determining the first compensation coefficient and determining the second compensation coefficient comprises:
setting the first compensation coefficient to a first value;
setting the second compensation coefficient to a second value;
measuring an adjacent channel leakage power ratio based at least in part on a first power amplifier output from the first power amplifier and a second power amplifier output from the second power amplifier;
determining whether the adjacent channel leakage power ratio is less than an adjacent channel leakage power ratio threshold;
adjusting the first compensation coefficient and the second compensation coefficient upon determining that the adjacent channel leakage power ratio is more than the adjacent channel leakage power ratio threshold.

7. The method of claim 6, wherein:
the first value is based at least in part on an estimation of a mutual coupling from the second antenna branch to the first antenna branch; and
the second value is based at least in part on an estimation of a mutual coupling from the first antenna branch to the second antenna branch.

8. The method of claim 6, wherein the adjacent channel leakage power ratio threshold is −45 dBc (decibels relative to carrier).

9. The method of claim 1, wherein the first antenna branch and the second antenna branch are two of a plurality of antenna branches of an antenna array of the network node, each of the plurality of antenna branches of the antenna array separated from each other by a distance, and compensation coefficients are only determined for pairs of antenna branches separated by a distance less than or equal to a threshold distance.

10. The method of claim 1, wherein the network node is an active-array-antenna system base station.

11. A network node, comprising:
one or more processors, the one or more processors configured to:
receive a first input signal from a first antenna branch baseband processing unit of a first antenna branch of the network node;
receive a second input signal from a second antenna branch baseband processing unit of a second antenna branch of the network node;
determine a first compensation coefficient;
determine a second compensation coefficient;
apply, using a mutual coupling processor, the first compensation coefficient to the second input signal received from the second antenna branch baseband processing unit to generate a first output signal;
apply, using the mutual coupling processor, the second compensation coefficient to the first input signal received from the first antenna branch baseband processing unit to generate a second output signal;
output the first output signal to a first power amplifier of the first antenna branch, the first output signal compensating for a mutual coupling from the second antenna branch to the first antenna branch, the first power amplifier operating in a non-linear region; and
output the second output signal to a second power amplifier of the second antenna branch, the second output signal compensating for a mutual coupling from the first antenna branch to the second antenna branch, the second power amplifier operating in the non-linear region.

12. The network node of claim 11, wherein the one or more processors are further configured to:
apply one or more pre-distortion techniques to transform a first output signal of the first antenna branch baseband processing unit to compensate for a non-linearity of the first power amplifier, the first output signal of the baseband first antenna branch processing unit corresponding to the first input signal;
apply the one or more pre-distortion techniques to transform a second output signal of the second antenna branch baseband processing unit to compensate for a non-linearity of the second power amplifier, the second output signal of the second antenna branch baseband processing unit corresponding to the second input signal.

13. The network node of claim 12, wherein the pre-distortion techniques include one of digital pre-distortion techniques and analog pre-distortion techniques.

14. The network node of claim 12, wherein:
the mutual coupling from the second antenna branch to the first antenna branch comprises a leakage signal power from the second power amplifier that is leaked in a backward direction and passes through the first power amplifier without being transformed by the one or more pre-distortion techniques; and
the mutual coupling from the first antenna branch to the second antenna branch comprises a leakage signal power from the first power amplifier that is leaked in a backward direction and passes through the second power amplifier without being transformed by the one or more pre-distortion techniques.

15. The network node of claim 11, wherein:
the first compensation coefficient and the second compensation coefficient are predefined;
the first compensation coefficient is based at least in part on an estimation of a mutual coupling from the second antenna branch to the first antenna branch; and
the second compensation coefficient is based at least in part on an estimation of a mutual coupling from the first antenna branch to the second antenna branch.

16. The network node of claim 11, wherein the one or more processors configured to determine the first compensation coefficient and determine the second compensation coefficient comprises one or more processors configured to:
set the first compensation coefficient to a first value;
set the second compensation coefficient to a second value;
measure an adjacent channel leakage power ratio based at least in part on a first power amplifier output from the first power amplifier and a second power amplifier output from the second power amplifier;
determine whether the adjacent channel leakage power ratio is less than an adjacent channel leakage power ratio threshold;
adjust the first compensation coefficient and the second compensation coefficient upon determining that the adjacent channel leakage power ratio is more than the adjacent channel leakage power ratio threshold.

17. The network node of claim 16, wherein:
the first value is based at least in part on an estimation of a mutual coupling from the second antenna branch to the first antenna branch; and
the second value is based at least in part on an estimation of a mutual coupling from the first antenna branch to the second antenna branch.

18. The network node of claim 16, wherein the adjacent channel leakage power ratio threshold is −45 dBc (decibels relative to carrier).

19. The network node of claim 11, wherein the first antenna branch and the second antenna branch are two of a plurality of antenna branches of an antenna array of the network node, each of the plurality of antenna branches of the antenna array separated from each other by a distance, and compensation coefficients are only determined for pairs of antenna branches separated by a distance less than or equal to a threshold distance.

20. The network node of claim 11, wherein the network node is an active-array-antenna system base station.

* * * * *